(12) United States Patent
Koshiishi et al.

(10) Patent No.: US 7,658,816 B2
(45) Date of Patent: Feb. 9, 2010

(54) FOCUS RING AND PLASMA PROCESSING APPARATUS

(75) Inventors: Akira Koshiishi, Nirasaki (JP); Hideaki Tanaka, Nirasaki (JP); Nobuyuki Okayama, Nirasaki (JP); Masaaki Miyagawa, Nirasaki (JP); Shunsuke Mizukami, Nirasaki (JP); Wataru Shimizu, Nirasaki (JP); Jun Hirose, Nirasaki (JP); Toshikatsu Wakaki, Nirasaki (JP); Tomonori Miwa, Nirasaki (JP); Jun Ooyabu, Nirasaki (JP); Daisuke Hayashi, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 513 days.

(21) Appl. No.: 10/933,383

(22) Filed: Sep. 3, 2004

(65) Prior Publication Data

US 2007/0169891 A1 Jul. 26, 2007

Related U.S. Application Data

(60) Provisional application No. 60/500,692, filed on Sep. 8, 2003.

(30) Foreign Application Priority Data

Sep. 5, 2003 (JP) ............................. 2003-314815
Feb. 27, 2004 (JP) ............................. 2004-055565

(51) Int. Cl.
  *C23F 1/00* (2006.01)
  *H01L 21/306* (2006.01)
  *C23C 16/00* (2006.01)

(52) U.S. Cl. .................. 156/345.43; 118/723 E

(58) Field of Classification Search ............... 118/723 E, 118/728; 156/345.47; 438/710, 723
See application file for complete search history.

(56) References Cited

U.S. PATENT DOCUMENTS 6,284,093 B1 * 9/2001 Ke et al. ................. 156/345.51

(Continued)

FOREIGN PATENT DOCUMENTS

JP 2000-188284 7/2000

(Continued)

OTHER PUBLICATIONS

U.S. Appl. No. 11/685,308, filed Mar. 13, 2007, Koshiishi.

*Primary Examiner*—Parviz Hassanzadeh
*Assistant Examiner*—Maureen Gramaglia
(74) *Attorney, Agent, or Firm*—Oblon, Spivak, McClelland, Maier & Neustadt, L.L.P.

(57) ABSTRACT

A focus ring and a plasma processing apparatus capable of improving an in-surface uniformity of a surface and reducing occurrences of deposition on a backside surface of a peripheral portion of a semiconductor wafer compared to a conventional case are provided. Installed in a vacuum chamber is a susceptor for mounting the semiconductor wafer thereon and a focus ring is installed to surround the semiconductor wafer mounted on the susceptor. The focus ring includes an annular lower member made of a dielectric, and an annular upper member made of a conductive material and mounted on the lower member. The upper member includes a flat portion which is an outer peripheral portion having a top surface positioned higher than a surface to be processed of the semiconductor wafer W, and an inclined portion which is an inner peripheral portion inclined inwardly.

8 Claims, 13 Drawing Sheets

U.S. PATENT DOCUMENTS

| | | |
|---|---|---|
| 6,344,105 B1 | 2/2002 | Daugherty et al. |
| 6,554,954 B2 * | 4/2003 | Ma et al. ............... 156/345.51 |
| 6,689,249 B2 | 2/2004 | Ke et al. |
| 6,714,033 B1 * | 3/2004 | Makhratchev et al. ...... 324/765 |
| 6,824,627 B2 * | 11/2004 | Dhindsa et al. ............... 156/60 |
| 6,841,943 B2 * | 1/2005 | Vahedi et al. .......... 315/111.71 |
| 6,896,765 B2 * | 5/2005 | Steger ................... 156/345.51 |
| 7,244,336 B2 * | 7/2007 | Fischer et al. .......... 156/345.51 |
| 2001/0035132 A1 * | 11/2001 | Kent et al. .................. 118/733 |
| 2002/0029745 A1 * | 3/2002 | Nagaiwa et al. .......... 118/723 E |
| 2002/0108933 A1 | 8/2002 | Hoffman et al. |
| 2006/0118044 A1 * | 6/2006 | Himori et al. ............ 118/723 E |

FOREIGN PATENT DOCUMENTS

| | | |
|---|---|---|
| JP | 2001-516948 | 10/2001 |
| JP | 2003-503841 | 1/2003 |

* cited by examiner

FIG.3
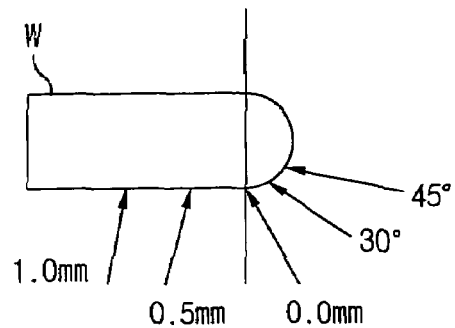
FIG.4A
|  | 0.5mm | 0.0mm | 30° | 45° |
|---|---|---|---|---|
| COMPARATIVE EXAMPLE | 27.0 | 73.05 | 121.5 | 184.3 |
| EXAMPLE 1 | 0 | 61.0 | 61.5 | 25.5 |
| EXAMPLE 2 | 0 | 14.5 | 26.0 | 0 |
FIG.4B
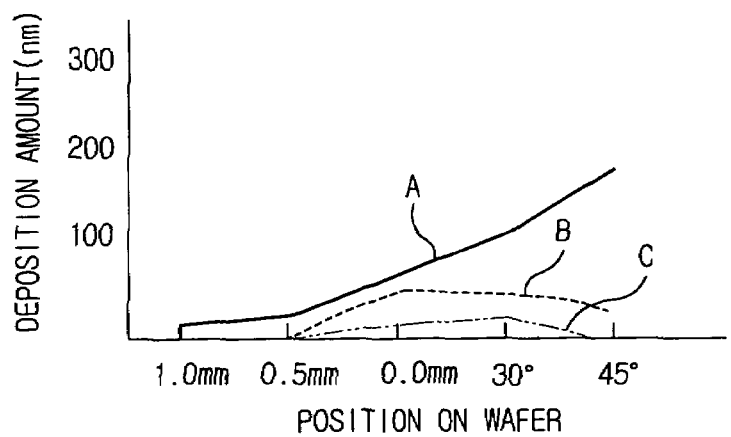

FOCUS RING AND PLASMA PROCESSING APPARATUS

FIELD OF THE INVENTION

The present invention relates to a plasma processing apparatus and a focus ring provided in a processing chamber for carrying out a plasma process, e.g., an etching process, on a substrate such as a semiconductor wafer or the like.

BACKGROUND OF THE INVENTION

Conventionally, a plasma processing apparatus such as an etching processing apparatus has been widely used in, e.g., a manufacturing process of, e.g., a fine electric circuit of a semiconductor device.

In such a plasma processing apparatus, a substrate to be processed, e.g., a semiconductor wafer, is disposed in a processing chamber whose inner space is configured to be capable of being airtightly sealed, and a plasma is generated in the processing chamber to be applied to the substrate to be processed to be used in performing a plasma process such as an etching.

Further, the plasma processing apparatus may include an annular member called a focus ring disposed to surround a semiconductor wafer serving as a substrate to be processed. The focus ring is installed, for example, for the purpose of confining a plasma, ameliorating discontinuity in a bias potential in a surface of the semiconductor wafer due to a fringing effect and performing a uniform and satisfactory process at a peripheral portion of the semiconductor wafer as well as at a central portion thereof.

There is known a plasma processing apparatus configured to prevent reactant species in a plasma from being concentrated around a lower electrode and reduce a processing speed at the peripheral portion of the semiconductor wafer, wherein the focus ring is disposed to surround the semiconductor wafer as described above, and a dielectric is disposed to be in contact with the plasma to thereby displace the plasma upward in an axial direction to be kept away from the lower electrode (see, for example, Reference Patent 1).

Further, as mentioned above, one of the purposes of the focus ring is to reduce the discontinuity in the bias potential. Thus, conventionally, a surface (top surface) of the focus ring and a surface of a semiconductor wafer to be processed are set to be on a substantially same plane, that is, at an approximately same height; the surface (top surface) of the focus ring is set to be higher than the surface to be processed of the semiconductor wafer; or a material of the focus ring is selectively chosen to help reducing the discontinuity in the bias potential (see, for example, Reference Patent 2).

[Reference Patent 1]
Japanese Patent Laid-open Application No. 2001-516948 (pages 13 to 41, FIGS. 1 to 7)

[Reference Patent 2]
Japanese Patent Laid-open Application No. 2003-503841 (pages 12 to 22, FIGS. 2 to 6)

As described above, a focus ring is conventionally used in a plasma processing apparatus to improve uniformity of a process.

FIG. 15 illustrates an example of a conventional focus ring, wherein an annular focus ring 101 made of a conductive material such as silicon is disposed on a susceptor 100 also serving as a low electrode to surround a semiconductor wafer W, i.e., a substrate to be processed.

Moreover, in the example illustrated in FIG. 15, a top surface of the focus ring 101 is of a height approximately identical to that of a surface to be processed (surface) of the semiconductor wafer W. As a result, an electric field above the focus ring 101 becomes approximately identical to that above the surface of the semiconductor wafer W, whereby reducing discontinuity in a bias potential due to a fringing effect. Thus, as shown by a dotted line in the drawing, a plasma sheath over the surface of the semiconductor wafer W and that over the focus ring 101 become of an approximately same height. By such a plasma sheath, as indicated by arrows in the drawing, incident ions fall vertically on the surface of the semiconductor wafer W even in a peripheral portion of the semiconductor wafer W.

However, using the focus ring 101 may result in a so-called deposition, in which undesirable deposits made of CF-based polymer and the like are adhered to a backside surface of the peripheral portion (edge portion) of the semiconductor wafer W.

A careful research on a cause of the deposition has resulted in a following conjecture. When using the above focus ring 101, the semiconductor wafer W and the focus ring 101 are approximately of a same potential and, thus, an electric field whose electric lines of force are indicated by dotted lines in an enlarged view of FIG. 16 is formed between the peripheral portion (edge portion) of the semiconductor wafer W and an inner peripheral portion of the focus ring 101. Accordingly, as indicated by solid arrows in the drawing, the plasma can easily reach the backside surface of the semiconductor wafer W through a portion between the peripheral portion (edge portion) of the semiconductor wafer W and the inner peripheral portion of the focus ring 101. Therefore, it seems that the deposition occurs on the backside surface of the peripheral portion (edge portion) of the semiconductor wafer W by the plasma that reaches the backside surface of the semiconductor wafer W.

SUMMARY OF THE INVENTION

The present invention is conceived from the above conventional drawbacks; and it is, therefore, an object of the present invention to provide a focus ring and a plasma processing apparatus capable of performing a good and uniform process in a peripheral portion of a semiconductor wafer as well as in a central portion of the semiconductor wafer, improving in-surface uniformity in a process and reducing occurrences of deposition on a backside surface side of a peripheral portion of the semiconductor wafer compared to a conventional case.

In accordance with the present invention, there is provided a focus ring having an annular shape, disposed to surround a substrate to be processed on a lower electrode for mounting the substrate to be processed thereon in a processing chamber for accommodating the substrate to be processed on which a specified plasma process is to be performed, which includes a lower member made of a dielectric; and an upper member disposed on the lower member and made of a conductive material, wherein the upper member is disposed a predetermined distance away from a peripheral portion of the substrate to be processed and includes an inclined portion inclined inwardly on a top surface thereof, and an end of the outer periphery of the inclined portion is positioned at least higher than a surface to be processed of the substrate to be processed.

Further, in the above-described focus ring, it is preferable that a conductive member is installed between the lower electrode and the lower member.

Furthermore, in the above-described focus ring, it is preferable that the conductive member is made of silicon or silicone rubber.

Still further, in the above-described focus ring, it is preferable that the outer periphery of the inclined portion is a flat portion positioned higher than the surface to be processed of the substrate to be processed.

Moreover, in the above-described focus ring, it is preferable that the conductive material is silicon, carbon or SiC.

In addition, in the above-described focus ring, it is preferable that a height h of the outer periphery of the inclined portion from the surface to be processed of the substrate to be processed is in a range of $0 < h \leq 6$ mm.

Further, in the above-described focus ring, it is preferable that a horizontal direction length l of the inclined portion in a vertical section of the upper member is in a range of $0.5 \text{ mm} \leq l \leq 9 \text{ mm}$.

Furthermore, in the above-described focus ring, it is preferable that a predetermined gap C1 between the upper member and the peripheral portion of the substrate to be processed is in a range of $0.3 \text{ mm} \leq C1 \leq 1.5 \text{ mm}$.

Moreover, in the above-described focus ring, the lower member provides a high-frequency coupling for a plasma with the lower electrode and increases an impedance for a high frequency applied to the lower electrode.

In accordance with the present invention, there is further provided a focus ring having an annular shape, disposed to surround a substrate to be processed on a lower electrode for mounting the substrate to be processed thereon in a processing chamber for accommodating the substrate to be processed on which a specified plasma process is to be performed, which includes a lower member made of a dielectric; and an upper member disposed on the lower member and made of a conductive material, wherein the upper member is connected to a ground potential for a high frequency power.

Further, in the above-described focus ring, it is preferable that the upper member is connected to the ground potential for the high frequency power by a high frequency grounding member, whose surface is coated with an insulating layer, made of a conductive member and the high frequency grounding member is configured to prevent a DC current from flowing therein by the insulating layer.

Furthermore, in the above-described focus ring, it is preferable that an insulation member is disposed between the lower electrode and the high frequency grounding member.

Moreover, in the above-described focus ring, it is preferable that an annular insulation member is disposed at an outer periphery of the upper member.

In addition, in the above-described focus ring, it is preferable that the upper member is disposed such that a bottom of the upper member is positioned higher by from 1.5 to 2.5 mm than a top surface of the substrate to be processed.

Besides, in the above-described focus ring, it is preferable that a temperature of the upper member is equal to or higher than 250° C. during a plasma process.

Further, in the above-described focus ring, it is preferable that a temperature of the lower member is equal to or higher than 100° C. during a plasma process.

In addition, in the above-described focus ring, it is preferable that a predetermined gap is provided between the upper member and the lower member.

Furthermore, in the above-described focus ring, it is preferable that the predetermined gap between the upper member and the lower member is about 0.5 mm.

Moreover, in the above-described focus ring, it is preferable that a diametrical direction length of a portion of the lower member which faces the upper member with the predetermined gap therebetween ranges from 5 to 10 mm.

In accordance with the present invention, there is still further provided a plasma processing apparatus including a processing chamber for accommodating a substrate to be processed on which a specified plasma process is to be performed; a lower electrode, installed in the processing chamber, for mounting the substrate to be processed thereon; an annular lower member made of a dielectric and disposed on the lower electrode to surround the substrate to be processed; and an annular upper member disposed on the lower member and made of a conductive material, wherein the upper member is disposed a predetermined distance away from a peripheral portion of the substrate to be processed and includes an inclined portion inwardly inclined on a top surface thereof, and an end of the outer periphery of the inclined portion is positioned at least higher than a surface to be processed of the substrate to be processed.

Further, in the above-described plasma processing apparatus, it is preferable that a conductive member is installed between the lower electrode and the lower member.

Furthermore, in the above-described plasma processing apparatus, it is preferable that the conductive member is made of silicon or silicone rubber.

Moreover, in the above-described plasma processing apparatus, it is preferable that the outer periphery of the inclined portion of the upper member is a flat portion positioned higher than the surface to be processed of the substrate to be processed.

In addition, in the above-described plasma processing apparatus, it is preferable that the conductive material is silicon, carbon or SiC.

Further, in the above-described plasma processing apparatus, it is preferable that a height h of the outer periphery of the inclined portion from the surface to be processed of the substrate to be processed is in a range of $0 < h \leq 6$ mm.

Further, in the above-described plasma processing apparatus, it is preferable that a horizontal direction length l of the inclined portion in a vertical section of the upper member is in a range of $0.5 \text{ mm} \leq l \leq 9 \text{ mm}$.

Furthermore, in the above-described plasma processing apparatus, it is preferable that a predetermined gap C1 between the upper member and the peripheral portion of the substrate to be processed is in a range of $0.3 \text{ mm} \leq C1 \leq 1.5 \text{ mm}$.

In addition, in the above-described plasma processing apparatus, it is preferable that the lower member provides a high-frequency coupling for a plasma with the lower electrode and increases an impedance for a high frequency applied to the lower electrode.

In accordance with the present invention, there is still further provided a plasma processing apparatus including a processing chamber for accommodating a substrate to be processed on which a predetermined plasma process is to be performed; a lower electrode, installed in the processing chamber, for mounting the substrate to be processed thereon; an annular lower member made of a dielectric and disposed on the lower electrode to surround the substrate to be processed; and an annular upper member disposed on the lower member, made of a conductive material, and connected to a ground potential for a high frequency power.

In accordance with the present invention, there is still further provided a plasma processing apparatus including a depressurizable processing chamber, an upper electrode and a lower electrode, the upper electrode and the lower electrode being disposed to face each other in the depressurizable processing chamber, for generating a plasma between the upper electrode and the lower electrode by a high frequency power supply to thereby perform a plasma process on a substrate to be processed on the lower electrode, including a focus ring, disposed around the substrate to be processed on the lower electrode, including a lower member made of a dielectric; and an upper member disposed on the lower member and made of a conductive material, wherein the lower member is provided with a predetermined gap which prevents an abnormal discharge in a backside surface of the substrate to be processed and the lower electrode; the upper member surrounds the substrate to be processed closely enough to generate an electric field therebetween; and a high frequency supplied from the lower electrode is coupled to the upper member.

Further, in the above-described plasma processing apparatus, the lower member enters inwardly from an end surface of the substrate to be processed and is disposed to be covered by the substrate to be processed.

In accordance with the present invention, a good and uniform process can be performed in a peripheral portion of a semiconductor wafer as well as in a central portion of the semiconductor wafer and the in-surface uniformity of a process can be improved while occurrences of deposition on a backside surface of a peripheral portion of the semiconductor wafer can be reduced compared to a conventional case.

BRIEF DESCRIPTION OF THE DRAWINGS

FIG. 3 explains deposition measurement regions;

FIGS. 4A and 4B offer a deposition measurement result in the measurement regions shown in FIG. 3;

DETAILED DESCRIPTION OF THE PREFERRED EMBODIMENT

Hereinafter, the present invention will be described in detail with reference to the accompanying drawings.

Figure 1:
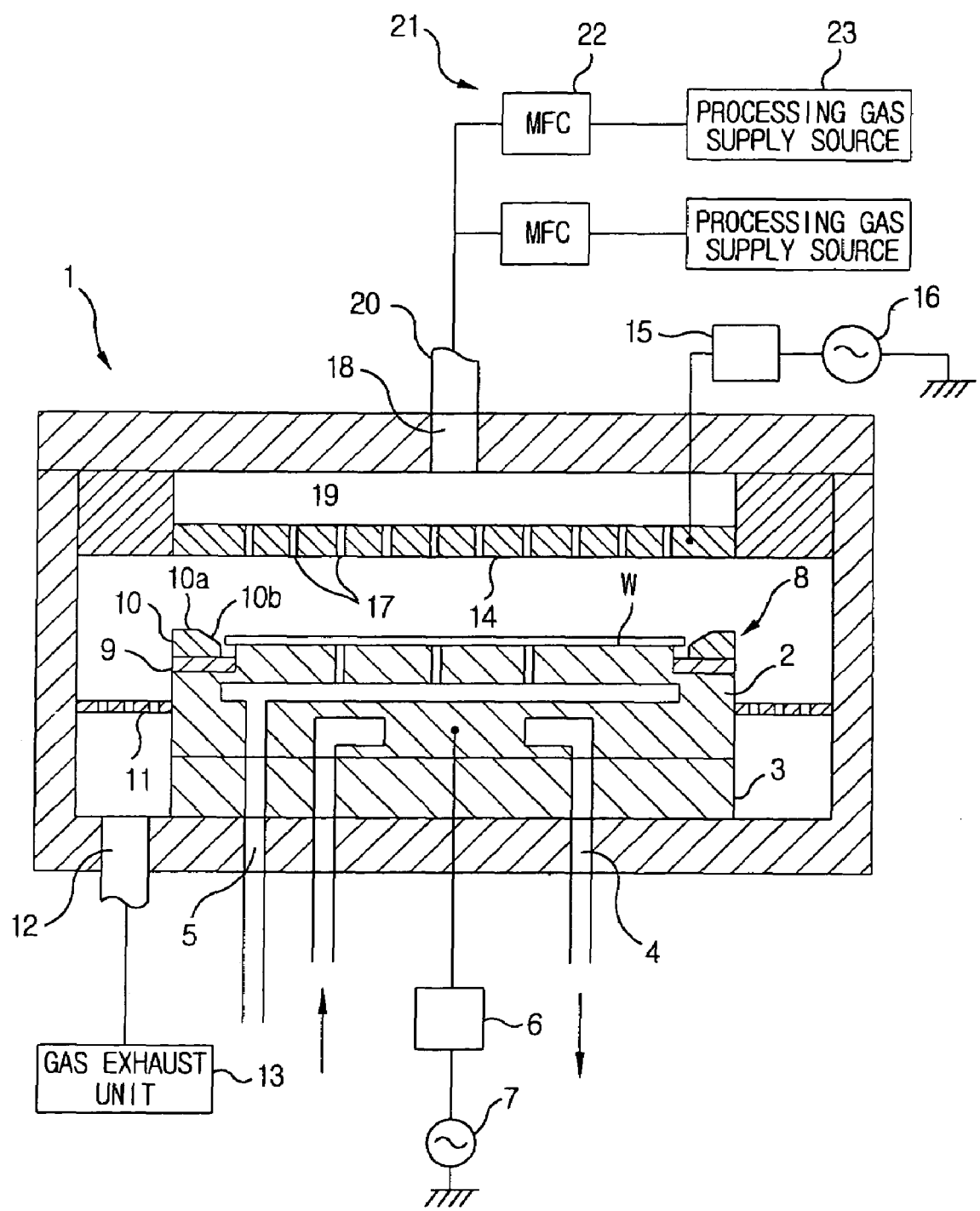
FIG. 1 shows a schematic configuration of a plasma processing apparatus in accordance with a preferred embodiment of the present invention.

FIG. 1 shows a schematic configuration of a whole plasma processing apparatus (etching apparatus) in accordance with a preferred embodiment of the present invention. A reference numeral 1 illustrates a cylindrical processing chamber (vacuum chamber) made of aluminum or the like which can be airtightly sealed.

A susceptor 2 also serving as a lower electrode is installed in the vacuum chamber 1, and the susceptor 2 is formed of a conductive material such as aluminum and has a block shape.

The susceptor 2 is supported by an insulating plate 3 formed of ceramic or the like in the vacuum chamber 1. An electrostatic chuck (not shown) for attracting and holding the semiconductor wafer W is installed on a semiconductor wafer W mounting surface of the susceptor 2.

Additionally, installed in the susceptor 2 are a heat transfer medium path 4 for circulating an insulating fluid serving as a heat transfer medium to control a temperature and a gas flow path 5 for supplying a temperature control gas such as a helium gas to a backside surface of the semiconductor wafer W.

Further, the susceptor 2 is controlled to be kept at a predetermined temperature by circulating an insulating fluid controlled to be maintained at a predetermined temperature in the heat transfer medium path 4. Furthermore, the temperature control gas is supplied between the susceptor 2 and the backside surface of the semiconductor wafer W through the gas flow path 5 to thereby facilitate a heat exchange therebetween and efficiently control the semiconductor wafer W to be very accurately held at a predetermined temperature.

Moreover, a high frequency power supply (RF power supply) 7 is connected to the susceptor 2 via a matching unit 6 and a high frequency power of a predetermined frequency is supplied from the high frequency power supply 7 thereto.

Besides, a focus ring 8 is installed on a peripheral portion of the susceptor 2. The focus ring 8 includes an annular lower member 9 made of a dielectric (for example, quartz, ceramics such as alumina, resin such as Vespel (a registered trademark), or the like), and an annular upper member 10 made of a conductive material (for example, silicon, carbon, SiC or the like) and mounted on the lower member 9. Further, the focus ring 8 is disposed to surround a semiconductor wafer W, i.e., a substrate to be processed.

Figure 2:
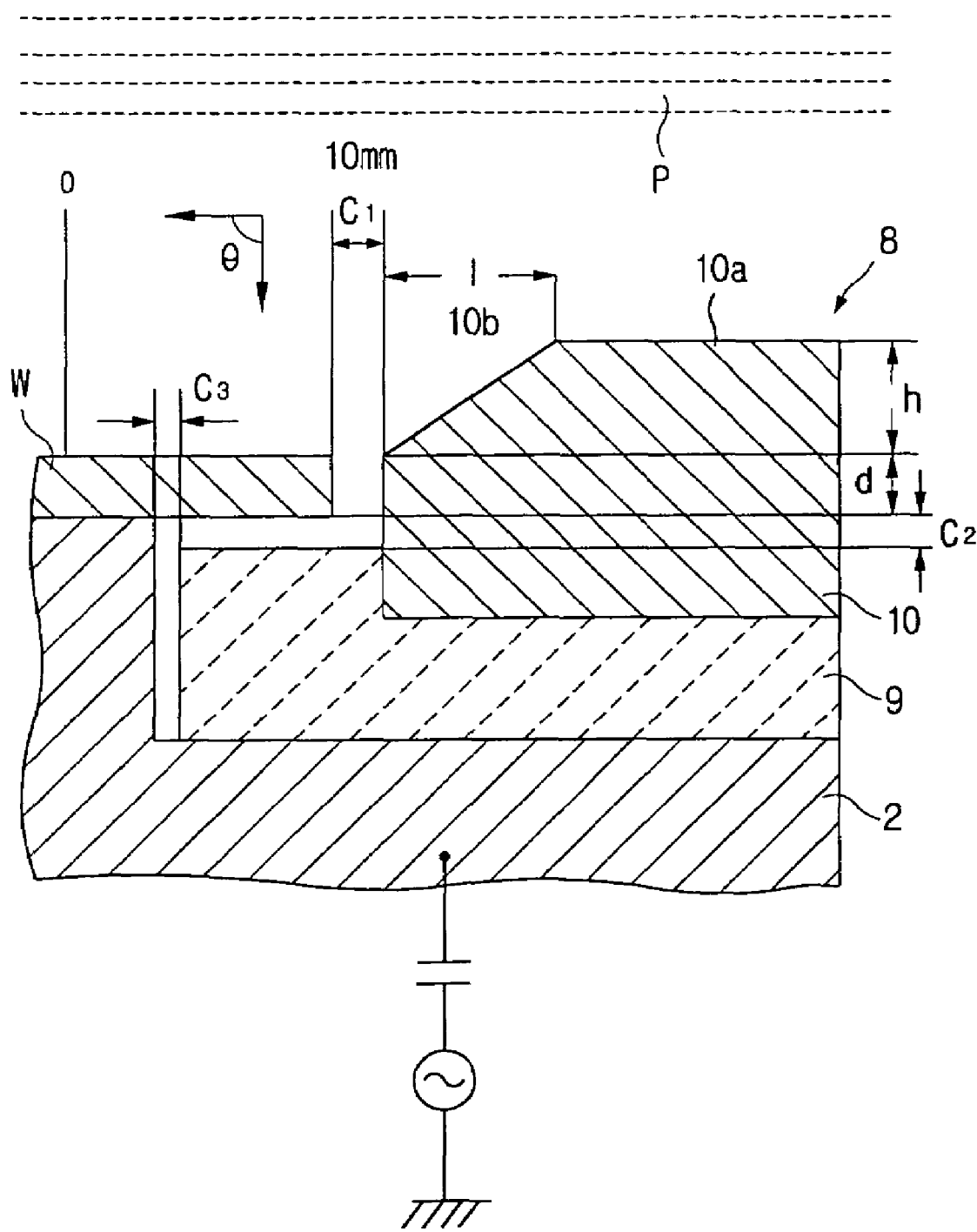
FIG. 2 illustrates an enlarged principal part of a focus ring in the plasma processing apparatus shown in FIG. 1.

As shown in FIG. 2, the upper member 10 includes a flat portion 10a which is an outer peripheral portion having a top surface positioned higher than a surface to be processed of the semiconductor wafer W, and an inclined portion 10b which is an inner peripheral portion inclined inwardly. Further, the upper member 10 is disposed such that a gap C1 is formed between the upper member 10 and a peripheral portion of the semiconductor wafer W. Moreover, a notation P in FIG. 2 represents a plasma. In the region of the focus ring 8, the susceptor (lower electrode) 2 is high frequency coupled (RF coupling) to a high frequency power applied from the high frequency power supply 7 through the lower member 9 and, thus, a high frequency impedance increases with the presence of the lower member 9 (a dielectric) interposed therebetween.

There will now be explained why the focus ring 8 has the above configuration. As described above, since the semiconductor wafer W and the focus ring 101 are of an approximately same potential in FIGS. 15 and 16, a plasma can easily reach a backside surface of an end portion of the semiconductor wafer W due to a shape of the electric field.

Figure 17:
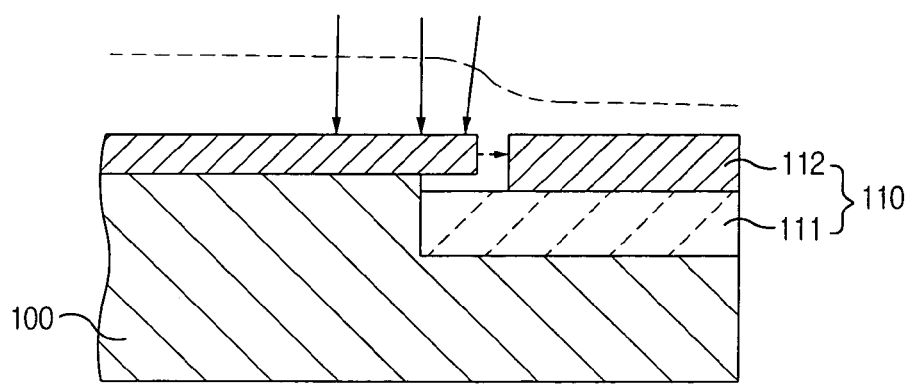
FIG. 17 provides states of an electric field and a plasma sheath in a focus ring made of a dielectric.

Therefore, as shown in FIG. 17, a focus ring 110 having a dielectric ring 111 and a conductive ring 112 thereon is employed to thereby generate a potential difference between the semiconductor wafer W and the conductive ring 112. Thus, an electric field is formed such that electric force lines originating from an end portion of the semiconductor wafer W end on the conductive ring 112 as indicated by a dotted arrow in the drawing, and the electric field can prevent a plasma from reaching the backside surface of the end portion of the semiconductor wafer W.

However, when using the focus ring 110, as shown by a dotted line in FIG. 17, a thickness of a plasma sheath generated over the semiconductor wafer W is different from that of a plasma sheath generated over the focus ring 110. As a result, an electric field is slanted in the peripheral portion of the semiconductor wafer W and incident ions fall obliquely on a surface of the semiconductor wafer W, whereby an etching is performed obliquely and uniformity of the etching process is deteriorated.

Therefore, the above-mentioned focus ring 8 is employed in the preferred embodiment so as to prevent a plasma from reaching the backside surface of the end portion of the semiconductor wafer W and, further, prevent the electric field from inclining in the peripheral portion of the semiconductor wafer W to suppress deterioration of uniformity in the etching process.

Further, an annular gas exhaust ring 11 having a plurality of gas exhaust holes is installed outside the focus ring 8, and a processing space in the vacuum chamber 1 is evacuated through the gas exhaust ring 11 by a vacuum pump and the like of a gas exhaust unit 13 connected to a gas exhaust port 12.

Meanwhile, on a ceiling wall portion above the susceptor 2 in the vacuum chamber 1, a shower head 14 is installed so as to face the susceptor 2 in parallel. The susceptor 2 and the shower head 14 function as a pair of electrodes (an upper electrode and a lower electrode). Further, a high frequency power supply 16 is connected to the shower head 14 via a matching unit 15.

The shower head 14 has a plurality of gas discharge openings 17 formed on the bottom surface thereof and a gas inlet 18 at the upper portion thereof. Further, a gas diffusion cavity 19 is formed inside the shower head 14. A gas supply line 20 is connected to the gas inlet 18 and a gas supply system 21 is connected to the other end portion of the gas supply line 20. The gas supply system 21 includes a mass flow controller (MFC) 22 for controlling gas flow rates and a processing gas supply source 23 for supplying, for example, an etching processing gas.

Hereinafter, there will be described a sequence of an etching process using the above etching apparatus.

First, after opening a gate valve (not shown) installed at the vacuum chamber 1, the semiconductor wafer W is loaded into the vacuum chamber 1 by a transfer mechanism (not shown) through a load lock chamber (not shown) provided adjacent to the gate valve and mounted on the susceptor 2. Next, the transfer mechanism is retracted out of the vacuum chamber 1 and then the gate valve is closed.

Thereafter, the inside of the vacuum chamber 1 is evacuated to a predetermined vacuum level by the vacuum pump of the gas exhaust unit 13 through the gas exhaust port 12, and a specified processing gas is supplied into the vacuum chamber 1 from the processing gas supply source 23.

In such a state, a plasma is generated by supplying a specified high frequency power of a relatively low frequency from the high frequency power supply 7 and a specified high frequency power of a relatively high frequency from the high frequency power supply 16, thereby performing a plasma etching on the semiconductor wafer W.

Then, after a specified etching process has been carried out, the etching process is stopped by stopping supplying from the high frequency power supplies 7 and 16, and the semiconductor wafer W is unloaded from the vacuum chamber 1 in a reverse order of the above-described sequence.

During the plasma etching process, since the focus ring 8 in accordance with the preferred embodiment, as described above, includes the lower member 9 made of a dielectric and mounted on the susceptor 2; and the upper member 10 disposed on the lower member 9, an impedance of the upper member 10 (impedance for a high frequency power applied to the susceptor 2) becomes higher than that of the semiconductor wafer W. As a result, a potential of the upper member 10 is lowered and a potential difference is generated between the semiconductor wafer W and the upper member 10. An electric field formed by the potential difference serves to prevent the plasma from reaching the backside surface of the peripheral portion of the semiconductor wafer W to thereby prevent CF-based polymer and the like from being deposited on the backside surface of the peripheral portion of the semiconductor wafer W.

Figure 15:
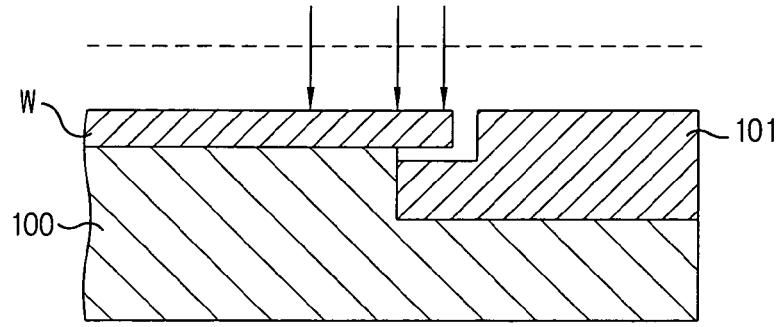
FIG. 15 describes a configuration of a conventional focus ring.
Figure 16:
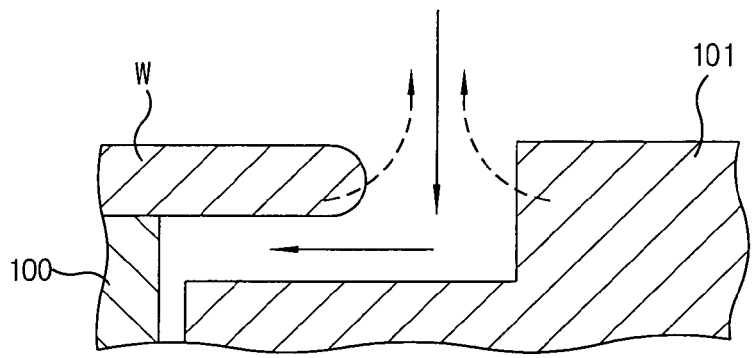
FIG. 16 explains a state of an electric field in the focus ring shown in FIG. 15.

FIG. 3 depicts an end portion (0.0 mm) of a horizontal portion on the backside surface of the peripheral portion of the semiconductor wafer W, portions inwardly separated by 1.0 mm and 0.5 mm from the end portion, and 30° and 45° portion of a cross section thereof, respectively. Further, FIGS. 4A and 4B show the result of measuring deposition amounts in the portions. With regard to FIG. 4A, Comparative Example shows the results obtained when the focus ring 101 illustrated in FIGS. 15 and 16 is employed; Example 1 shows the results obtained when the focus ring 8 illustrated in FIGS. 1 and 2 is employed with ashing; and Example 2 shows the results obtained when the focus ring 8 is employed without ashing. Further, with regard to a graph of FIG. 4B, a vertical axis represents deposition amounts; a horizontal axis stands for a position on the semiconductor wafer W; a solid line A is for Comparative Example; a dotted line B illustrates Example 1; and a dashed dotted line C represents Example 2. As shown in FIGS. 4A and 4B, in case when the focus ring 8 was employed, the deposition amount can be substantially reduced compared to the case when the focus ring 101 was employed.

Further, in accordance with the preferred embodiment, a potential difference is generated between the semiconductor wafer W and the upper member 10 by interposing the lower member 9 made of a dielectric. However, formed on a top surface of the upper member 10 are the inclined portion 10b inclined inwardly and flat portion 10a positioned higher than the surface to be processed of the semiconductor wafer W at the outer peripheral side of the inclined portion 10b and, namely, there is a portion positioned higher than the surface to be processed of the semiconductor wafer W on the top surface of the focus ring 8. Accordingly, a height of a boundary portion of a plasma sheath formed over the focus ring 8 can be lifted up to approximately the same height as that formed over the semiconductor wafer W to thereby prevent the electric field from inclining in the peripheral portion of the semiconductor wafer W.

Furthermore, the flat portion 10a of the upper member 10 in the focus ring 8, which is formed to be positioned higher than the surface to be processed of the semiconductor wafer W, serves to make the height of the plasma sheath higher, whereas the inclined portion 10b serves to make the change thereof gentle. Namely, the inclined portion 10b can suppress a sudden change of the electric field at the boundary portion between the semiconductor wafer W and the focus ring 8 and also prevent the electric field from inclining in an opposite direction to the direction shown in FIG. 17, for example.

From a result of an electric field simulation, a height h (that is, a distance from a lowest portion of the inclined portion 10b to a topmost portion thereof) of the inclined portion 10b illustrated in FIG. 2 is preferably in a range of $0<h\leq 6$ mm, and more preferably in a range of 2 mm≦h≦4 mm. Further, a horizontal direction length l of the inclined portion 10b shown in FIG. 2 is preferably 0.5 mm≦l≦9 mm, and more preferably in a range of 1 mm≦l≦6 mm. The horizontal direction length l of the inclined portion 10b can be made to be l=0, i.e., no inclined portion 10b, depending on the gap C1 between the end portion of the semiconductor wafer W and the focus ring 8. In this case, the gap C1 between the end portion of the semiconductor wafer W and the focus ring 8 is adjusted to suppress the sudden change in the electric field. Besides, a height d of a portion underneath the inclined portion 10b shown in FIG. 2 is preferably in a range of about 0≦d≦1 mm.

Further, since the potential difference is generated between the semiconductor wafer W and the focus ring 8, there is a possibility for generating an arcing on the semiconductor wafer W if the semiconductor wafer W and the focus ring 8 are excessively close to each other. On the other hand, if the semiconductor wafer W and the focus ring 8 are placed too far from each other, it reduces the above-mentioned effect of the electric field to prevent the plasma from reaching the backside surface side of the semiconductor wafer W. Accordingly, the gap C1 between the end portion of the semiconductor wafer W and the focus ring 8 shown in FIG. 2 is preferably in a range of 0.3 mm≦C1≦1.5 mm, and more preferably in a range of 1.0 mm≦C1≦1.5 mm. Furthermore, a gap C2 between a backside surface of the end portion of the semiconductor wafer W and the focus ring 8 shown in FIG. 2 is preferably 0.3 mm≦C2 and a gap C3 shown in FIG. 2 is preferably 0.4 mm≦C3, so that an identical abnormal discharge may not be generated.

Figure 5A:
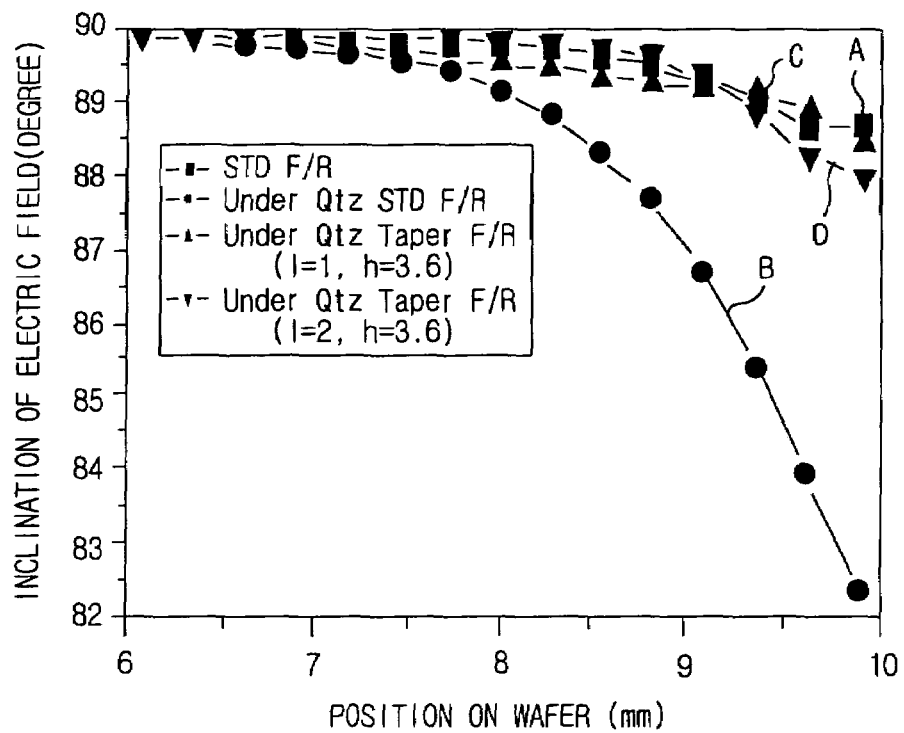
FIGS. 5A to 5C depict angles of electric fields in respective positions on a wafer.
Figure 5B:
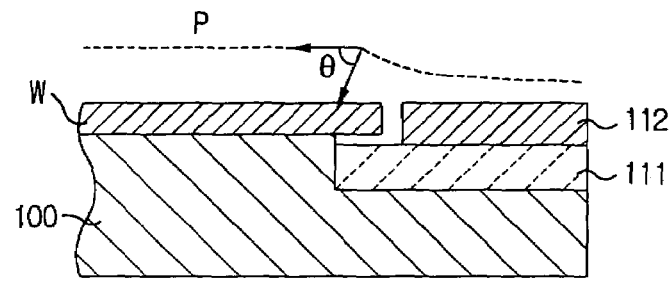
Figure 5C:
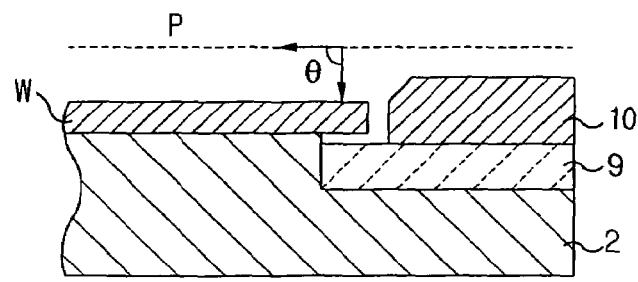

FIGS. 5A to 5C illustrate the results of measuring an inclination of the electric field in the peripheral portion of the semiconductor wafer W. In a graph of FIG. 5A, a vertical axis represents an angle of the electric field (an angle θ shown in FIG. 2) and a horizontal axis represents a position on a wafer (a relative position in an inner peripheral portion thereof when the end portion of the semiconductor wafer W is assumed to be of a width of 10 mm as shown in FIG. 2).

Moreover, with regard to FIG. 5A, a curved line A represented by quadrilateral marks is for the focus ring shown in FIG. 15; a curved line B represented by circular marks for the focus ring shown in FIG. 17; and a curved line C represented by triangle marks and a curved line D represented by reverse triangle marks for the focus ring configured in accordance with the preferred embodiment. Additionally, the triangle marks are the results obtained when l and h shown in FIG. 2 are 1 mm and 3.6 mm, respectively. The reverse triangle marks are the results obtained when l and h shown in FIG. 2 are 2 mm and 3.6 mm, respectively.

As shown in FIGS. 5A and 5B, in case of employing the focus ring shown in FIG. 17, the inclination of the electric field becomes larger in the peripheral portion of the semiconductor wafer W, and θ becomes about maximum 82°, i.e., resulting in an inward inclination of about 8°. On the contrary, in the preferred embodiment, θ is about maximum 88° or greater, that is, an inward inclination can be restricted to be about 2° at the most as shown in FIGS. 5A and 5C.

Further, when actually forming a hole in the semiconductor wafer W by such an etching and measuring inclination of the hole, a measurement result thereof was substantially identical to the result of the electric field inclination mentioned above.

As described above, in accordance with the preferred embodiment, occurrences of the deposition on the backside surface of the peripheral portion of the semiconductor wafer can be reduced compared to a conventional case. At the same time, since the inclination of electric field is suppressed in the peripheral portion of the semiconductor wafer, a substantially vertical etching can be carried out also in the peripheral portion of the semiconductor wafer and an in-surface uniformity of a process can be improved.

Besides, as described above, the expiration date of the focus ring 8 can be prolonged by configuring the focus ring 8 to have the inclined portion 10b and the flat portion 10a. That is, by employing the above configuration, it is possible to prevent a height of the plasma sheath over the focus ring 8 from being lowered when the focus ring 8 (the upper member 10) is abraded. Further, even when the focus ring 8 is somewhat abraded, incident ions can fall approximately vertically on the peripheral portion of the semiconductor wafer W.

Hereinafter, there will be described the result of investigation on how an abrasion of a focus ring influences a plasma sheath and incident angles of the ions falling on a surface of a semiconductor wafer W.

Figure 6:
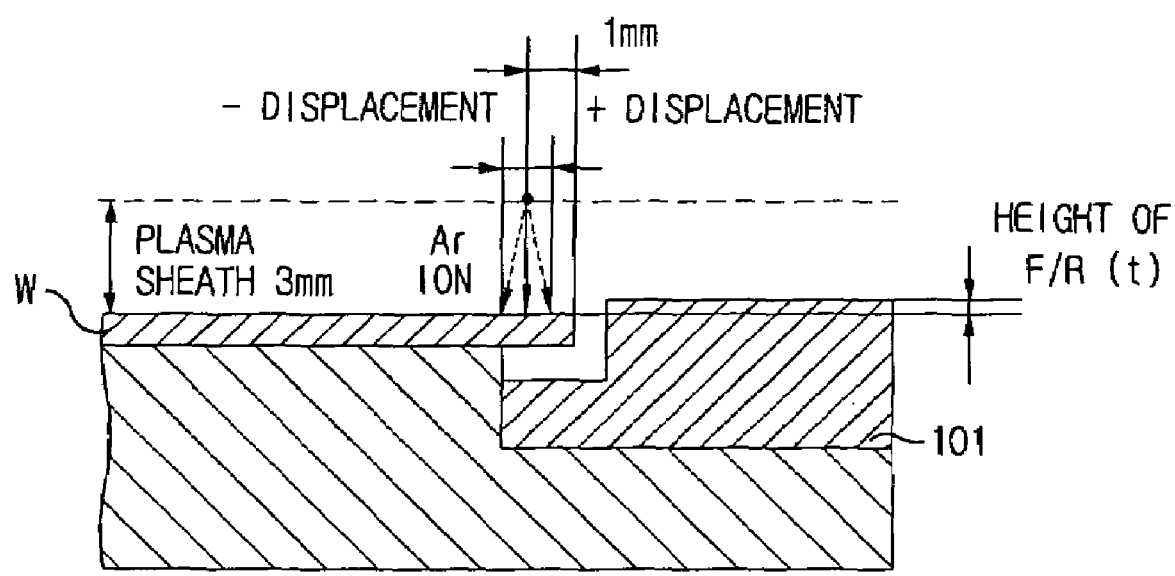
FIG. 6 explains a measurement method of a shift amount of an ion incident angle.

First, as shown in FIG. 6, a relationship between a height of a top surface and ion incident angles (illustrated by dotted arrows in the drawing) in a peripheral portion of a semiconductor wafer W was investigated in a focus ring 101 whose top surface is flat.

Further, a specific process performed to make the above investigation is a process forming a contact hole, via or the like, wherein a pressure ranges from about 2 to 11 Pa; a high frequency RF power ranges from 3 to 5 W; a low frequency RF power ranges from 3 to 5 W; the temperature of the semiconductor wafer W ranges from 80 to 120° C.; a distance between electrodes ranges from 25 to 70 mm; $C_4F_6$ or $C_5F_8$/$C_xH_yF_z(C_2F_6)$/Ar/$O_2$ in a gas system is 30~50/10~30/500~1500/30~50 sccm and the like.

In the above process, since a thickness of the plasma sheath formed over the semiconductor wafer W (having a diameter ranging from 200 to 300 mm) is about 3 mm, a position where an argon ion is vertically incident on the surface of the semiconductor wafer W from an upper end of the plasma sheath 3 mm thick, also being 1 mm apart from a peripheral portion of the semiconductor wafer W, is defined to be an origin, and an ion incident angle is evaluated by means of a displacement from the origin in a diametrical direction. In addition, in FIG. 6, a displacement in a left direction is set to be minus and a displacement in a right direction is set to be plus.

In the above case, when a height of the top surface of the focus ring (measured by setting a height of the surface to be processed (surface) of the semiconductor wafer W to be an origin while a plus direction is upward and a minus direction is downward) is +0.3 mm, the displacement of the ion from the incident position is +0.03 mm, and when the height of the top surface of the focus ring is −0.4 mm, the displacement of the ion from the incident position is −0.05 mm.

Thus, for comparison, the expiration date of the focus ring is supposed to be a period while the displacement of the ion from the incident position is in the above-mentioned range from +0.03 mm to −0.05 mm.

Further, as mentioned above, in the focus ring 101 whose top surface is flat, when the displacement of the ion from the incident position is in a range from +0.03 mm to −0.05 mm, the height of the top surface of the focus ring is in a range from +0.3 mm to −0.4 mm. Consequently, if the height of the focus ring 101 is set to be +0.3 mm at the beginning, the focus ring, wherein an abrasion amount is measured to be 0.7 mm on the top surface thereof, would be replaced with a new one.

Hereinafter, there will be described the result of an investigation on a relationship between a height t of the top surface of the focus ring (the surface of the flat portion) from a surface to be processed of a semiconductor wafer W and a displacement of an ion from an incident position, wherein l and h shown in FIG. 2 are varied in a focus ring whose top surface having a flat portion and an inclined portion similarly to the focus ring 8. Further, it is supposed that the focus ring gets abraded in a similar shape to that at the beginning.

Figure 7:
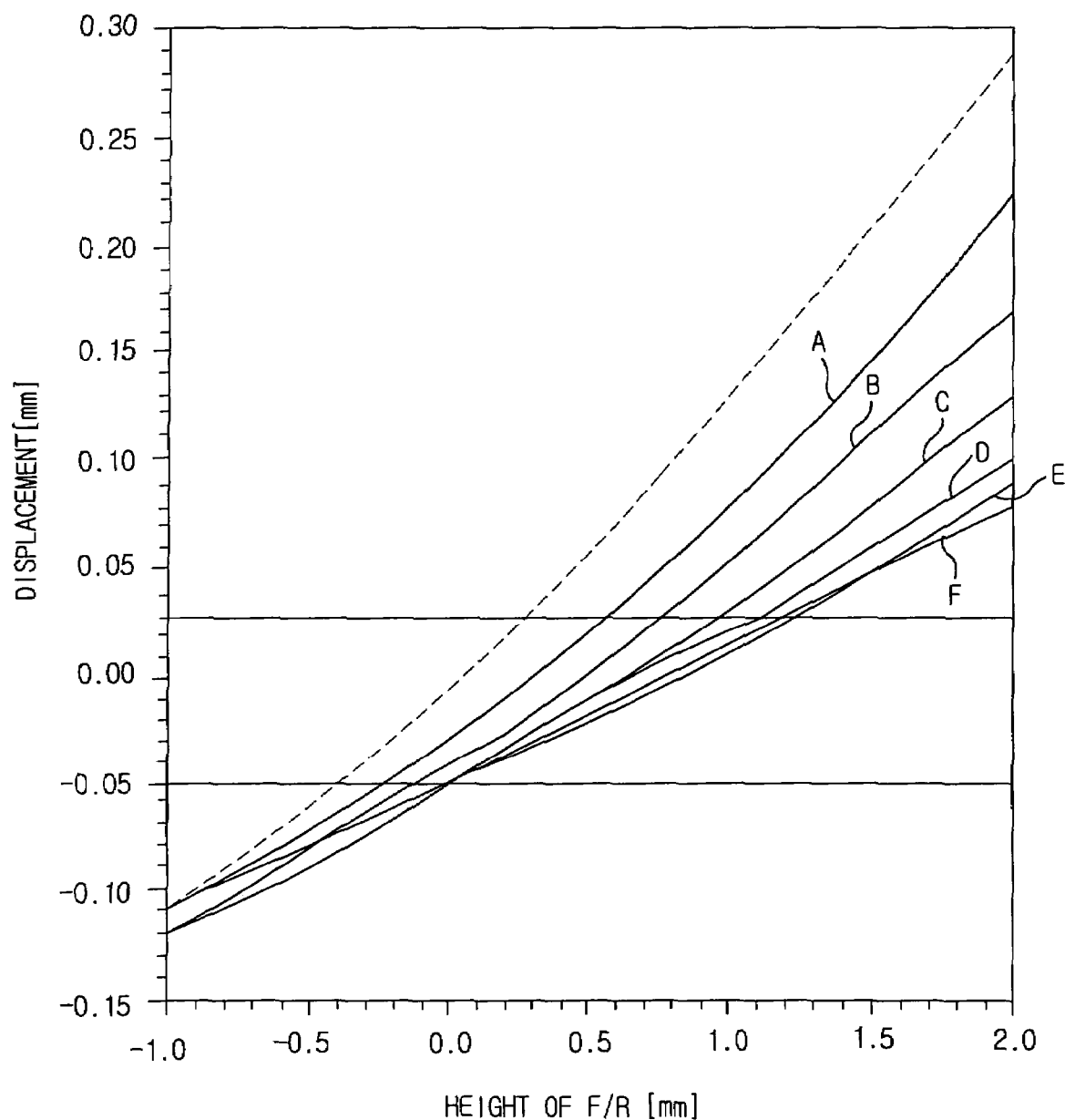
FIG. 7 offers a relationship between a variation in an ion incident angle and a height of a focus ring.

FIG. 7 illustrates relationships between a height t and a displacement when h is varied to be 0.5 mm (a curved line A), 1.0 mm (a curved line B), 1.5 mm (a curved line C), 2.0 mm (a curved line D), 2.5 mm (a curved line E) and 3.0 mm (a curved line F), respectively, while l is 3 mm (identical to the thickness of the plasma sheath). In the same drawing, a vertical axis represents a displacement (mm) of an ion from an incident position while a horizontal axis represents a height t (mm) of the top surface of the focus ring. Further, for comparison, a dotted line in the drawing presents the result obtained when the focus ring 101 whose top surface is flat is used.

As shown in the same drawing, as h becomes greater, an inclination of the curved line becomes more gentle, wherein a variation of the displacement of the ion corresponding to a variation of the height of the top surface of the focus ring becomes reduced. Accordingly, as h becomes greater in the above-described range, the expiration date and an exchange cycle of the focus ring can be prolonged. Moreover, the result shown in FIG. 7 can be numerically represented as follows, at h=0.5, permissible range of the height t: −0.3~+0.55 mm (0.85 mm)
at h=1.0, permissible range of the height t: −0.1~+0.8 mm (0.9 mm)
at h=1.5, permissible range of the height t: 0~+1.0 mm (1.0 mm)
at h=2.0, permissible range of the height t: 0~+1.1 mm (1.1 mm)
at h=2.5, permissible range of the height t: 0~+1.1 mm (1.1 mm)
at h=3.0, permissible range of the height t: 0~+1.2 mm (1.2 mm)

As described above, when l is 3 mm, identical to the thickness of the plasma sheath, and h is 0.5 mm, the permissible range of the height t becomes 0.85 mm, which shows a definite effect compared to the case of the focus ring whose top surface is flat (the permissible range of the height t is 0.7 mm). Further, when h is 3.0 mm, the permissible range of the height t becomes 1.2 mm, which is increased about 1.7 times compared to the height t in the focus ring whose top surface is flat.

Additionally, at h=3.0 mm, the height t of the top surface of the focus ring is +1.2 mm at the beginning. Therefore, when a height of the surface to be processed of the semiconductor wafer W is deemed as a reference, a beginning height of the lowest portion (an end portion of an inner peripheral side) of the inclined portion is −1.8 mm obtained by subtracting 3.0 mm from 1.2 mm, which is lower than the surface to be processed of the semiconductor wafer W.

Figure 8:
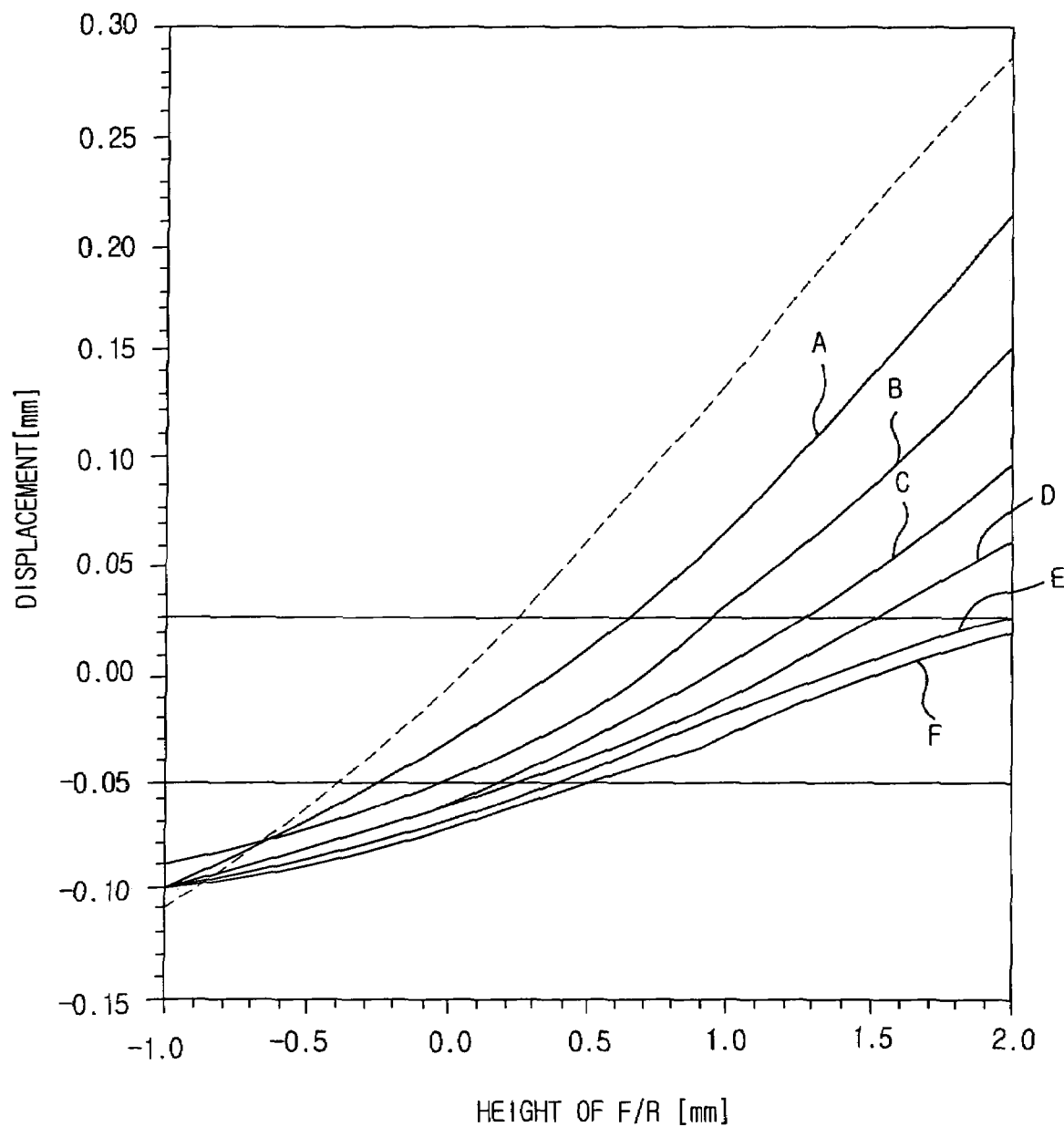
FIG. 8 shows a relationship between a variation in an ion incident angle and a height of a focus ring.

FIG. 8 illustrates relationships between a height t and a displacement when h is varied to be 0.5 mm (a curved line A), 1.0 mm (a curved line B), 1.5 mm (a curved line C), 2.0 mm (a curved line D), 2.5 mm (a curved line E) and 3.0 mm (a curved line F), respectively, while l is 6 mm (twice the thickness of the plasma sheath). In the same drawing, a vertical axis represents a displacement (mm) of an ion from an incident position while a horizontal axis represents a height t (mm) of the top surface of the focus ring. Further, for comparison, a dotted line in the drawing presents the result obtained when the focus ring 101 whose top surface is flat is used.

As shown in the same drawing, also in case of l=6 mm similarly as in case of l=3 mm, as h becomes greater, an inclination of the curved line becomes more gentle, wherein a variation of the displacement of the ion corresponding to a variation of the height of the top surface of the focus ring becomes reduced.

Additionally, the result shown in FIG. 8 can be numerically represented as follows, at h=0.5, permissible range of the height t: −0.3~+0.65 mm (0.95 mm)
at h=1.0, permissible range of the height t: 0~+1.0 mm (1.0 mm)
at h=1.5, permissible range of the height t: +0.2~+1.3 mm (1.1 mm)
at h=2.0, permissible range of the height t: +0.3~+1.6 mm (1.3 mm)
at h=2.5, permissible range of the height t: +0.4~+2.0 mm (1.6 mm)
at h=3.0, permissible range of the height t: +0.5~+2.1 mm (1.6 mm)

As described above, when l is 6 mm which is twice the thickness of the plasma sheath while h is 0.5 mm, the permissible range of the height t becomes 0.95 mm, which shows a definite effect compared to the case of the focus ring whose top surface is flat (the permissible range of the height t is 0.7 mm). Further, when h is set to range from 2.5 to 3.0 mm, the permissible range of the height t becomes 1.6 mm, which is increased two times or more compared to the height t in the focus ring whose top surface is flat.

Further, conventionally, the focus ring is exchanged for a new one, for example, when a total processing time is about 400 hours. In accordance with the present invention, an exchange cycle of the focus ring can be prolonged to about 800 hours or more.

Figure 9:
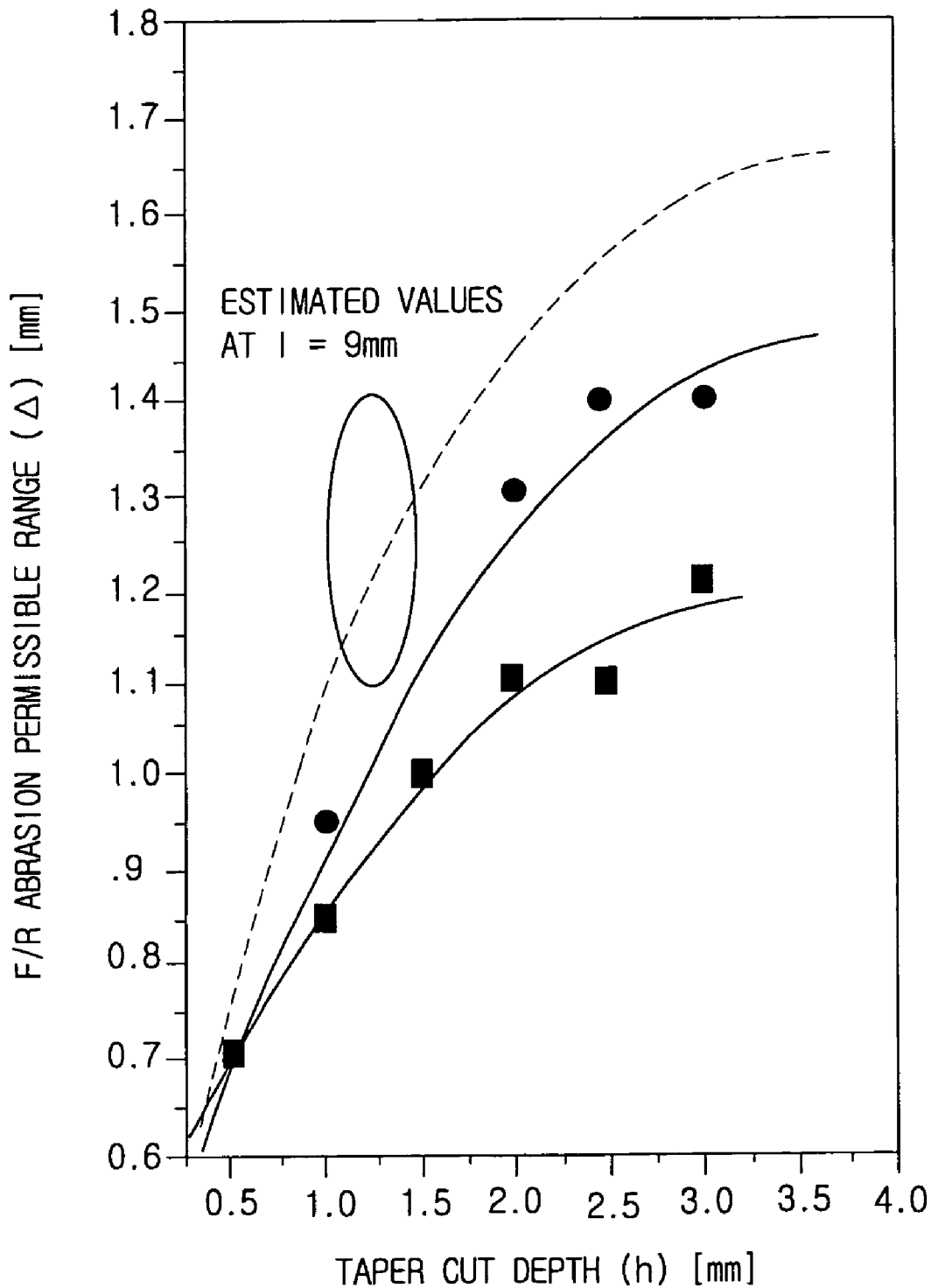
FIG. 9 provides a relationship between a taper cut depth and an abrasion permissible range of a focus ring.

FIG. 9 shows relationships of a permissible range Δ (mm) of an abrasion of a focus ring (F/R) represented by a vertical axis and h (a taper cut depth) (mm) represented by a horizontal axis in the above-described cases when l is 3 mm (indicated by quadrangles in the drawing) and 6 mm (indicated by circles in the drawing), and a case when a taper cut position l is 9 mm (indicated by a dotted line in the drawing), estimated from the above cases, respectively.

As shown in the same drawing, as h becomes relatively greater, the abrasion permissible range Δ of the focus ring becomes larger, but it tends to be saturated when h approaches to about 2.5 to 3.0 mm.

Further, the greater l is, the larger an abrasion permissible range Δ of the focus ring gets. Thus, it is preferable that l is at least equal to the thickness of the plasma sheath (3 mm) or more and, and more preferably twice the thickness of the plasma sheath (6 mm) or more.

As mentioned above, by configuring a focus ring to have an inclined portion and a flat portion, an abrasion permissible range Δ of the focus ring can be increased. Accordingly, an exchange cycle of the focus ring can be prolonged compared to a conventional case and, further, it is possible to reduce an operation cost and to improve an apparatus operation rate. Further, with a view of prolonging the expiration date of the focus ring, CVD-SiC is preferably employed as the material thereof. Particularly, since it becomes possible to produce CVD-SiC of a resistivity identical to that of Si (1 to 30 Ω), it is preferable to use CVD-SiC of such a resistivity. If the focus ring is configured to use CVD-SiC, it can have an electrical characteristic identical with that made of Si and an expiration date two to three times that made of Si.

Figure 10:
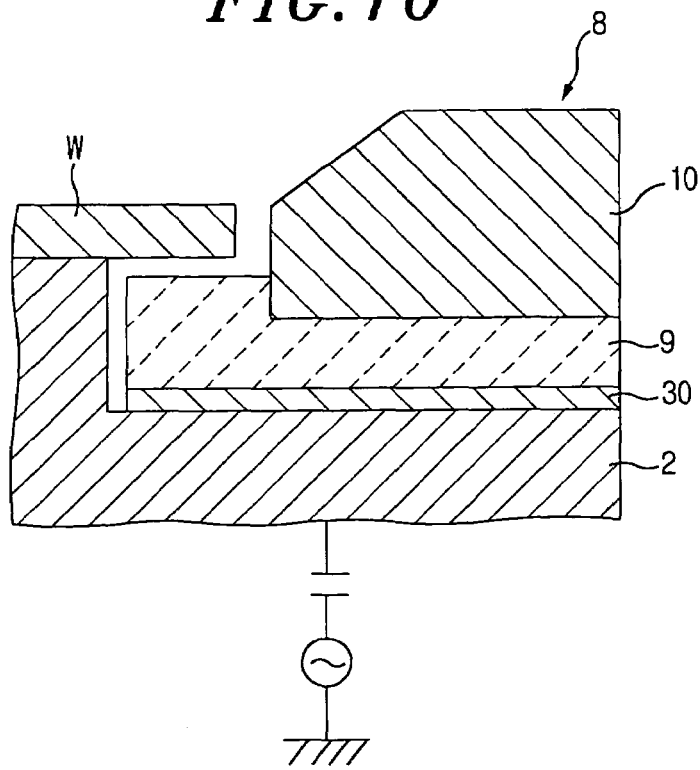
FIG. 10 explains a method for adjusting an impedance.

Meanwhile, in the focus ring 8, there is an optimal range in an impedance of the focus ring 8 and it is preferable to adjust the impedance value to be in the optimal range. Further, the impedance of the focus ring 8 can be adjusted by selecting a material of the lower member 9 made of a dielectric; changing a dielectric constant thereof; or varying a thickness thereof. That is, the impedance Z can be adjusted by changing a value of a capacitance C formed by interposing the lower member 9. Therefore, for example, as in the focus ring 8 illustrated in FIG. 10, by using the lower member 9 of a thin thickness and a conductive member 30 installed under the lower member 9, the capacitance C can be changed and the impedance Z can be adjusted to become a desired value. Furthermore, as described above, by means of the conductive member 30 interposed between the lower member 9 and the susceptor 2, a heat conductivity between the lower member 9 and the susceptor 2 can be improved, and the lower member 9 can be controlled to be kept at a predetermined temperature. Thus it is possible to prevent the lower member 9 from, e.g.,being overheated to have a bad influence on a process. In this case, it is preferable to select as the conductive member 30, for example, a ring-shaped silicon substrate, a silicone rubber sheet or the like, which is a good thermal conductive material.

At this time, an insulating member or the like (having a thickness of, e.g., 0.6 mm) is actually installed for forming an electrostatic chuck underneath the semiconductor wafer W and an impedance identical to that described above is induced by an influence of the insulating member. If the impedance Z is adjusted to satisfy the following:

$$(Z/Z_0)=60$$

wherein $Z_0$ is an impedance of the semiconductor wafer W, the impedance Z is obtained as follows:

$$Z=[\omega\in_0\cdot\in(S/D)]^{-1} \text{ (}\omega\text{: angular frequency)}$$

wherein S, D, $\in$ and $\in_0$ indicate an area of the top surface (or the bottom surface) of the lower member 9, a thickness thereof, a dielectric constant and a vacuum dielectric constant, respectively. Thus, in case that the lower member 9 is made of quartz and has an inner diameter of about 300 mm and an outer diameter of about 360 mm, it is preferable that a thickness thereof ranges approximately from 5 to 10 mm, and more preferably from 7 to 9 mm.

Figure 11:
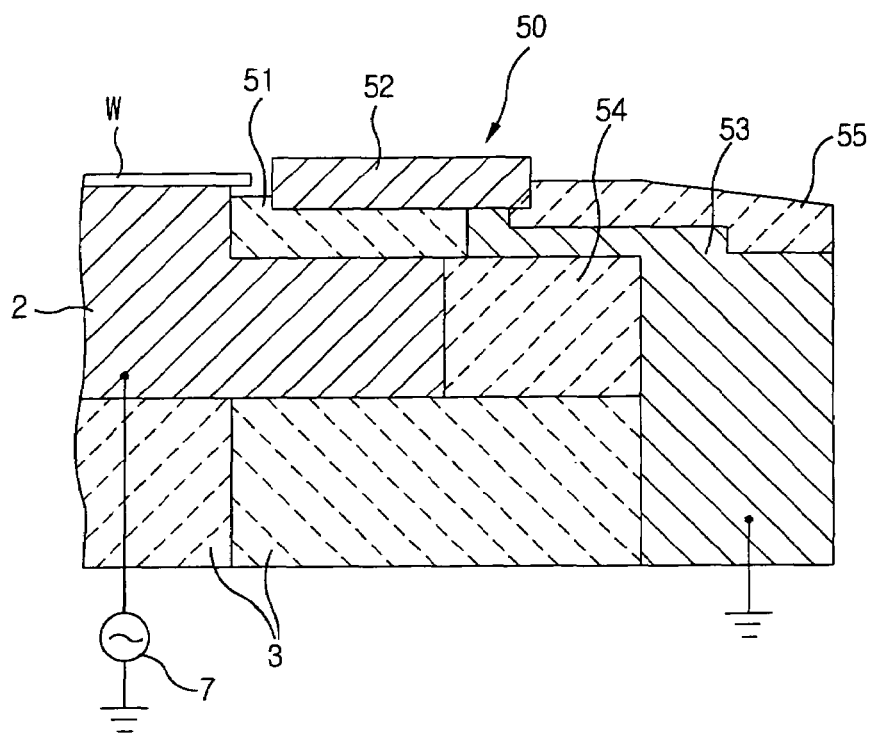
FIG. 11 sets forth a configuration of a focus ring in accordance with another preferred embodiment.

Hereinafter, there will be described another preferred embodiment. FIG. 11 sets forth schematically a cross sectional view showing a configuration of a focus ring in accordance with this preferred embodiment. As described above, a susceptor 2 on which a semiconductor wafer W is mounted is supported by an insulating plate 3 and a high frequency power supply 7 is connected to the susceptor 2.

Further, a focus ring 50 is installed on a peripheral portion of the susceptor 2. The focus ring 50 includes an annular lower member 51 made of a dielectric (for example, quartz, ceramics such as alumina, resin such as Vespel (a registered trademark) or the like), and an annular upper member 52 made of a conductive material (for example, silicon, carbon, SiC or the like) and mounted on the lower member 51. Further, the focus ring 50 is disposed to surround the semiconductor wafer W, i.e., a substrate to be processed.

The upper member 52 is made of a conductive material, e.g., aluminum, and connected to a ground potential for a high frequency power through a high frequency grounding member 53 whose surface is coated with an insulating layer (an insulating film) such as a thermally sprayed coating (for example, FCC (fine ceramics coat) of, e.g., Al/Al$_2$O$_3$ and Y$_2$O$_3$) made of ceramics. This insulating layer is formed to protect the high frequency grounding member 53 from the plasma and prevent a DC current from flowing therethrough. That is, the insulating layer is thick enough to prevent the DC current from passing therethrough to thereby block the DC current and prevent it from propagating further. On the other hand, a high frequency capable of being propagated on a surface of a solid body as a surface wave can be propagated on a surface layer of the high frequency grounding member 53 which serves as a ground channel of the high frequency. Further, a frequency cut filter such as a by-pass filter or a low pass filter, a frequency damping filter or the like may be interposed between the high frequency grounding member 53 and the ground depending on a frequency of a high frequency power applied for plasma generation in order to prevent the high frequency from returning. Furthermore, a switch unit which operates together with a process recipe may be installed between the high frequency grounding member 53 and the ground, thereby controlling whether the high frequency to be grounded or not at a specified time. Respectively disposed between the high frequency grounding member 53 and the susceptor 2, and at the outer peripheral side of the upper member 52 (on the high frequency grounding member 53) are ring-shaped insulation members 54 and 55 made of a dielectric (for example, quartz, ceramics such as alumina, resin such as Vespel (a registered trademark) or the like). The insulation member 54 is for preventing a DC voltage component from leaking to the outside from the susceptor 2. Further, the insulation member 55 serves to prevent a plasma from excessively spreading toward an outer peripheral direction, which in turn regulates an electric field to prevent the plasma from excessively spreading and leaking to a gas exhaust side from a gas exhaust baffle (not shown).

Figure 12:
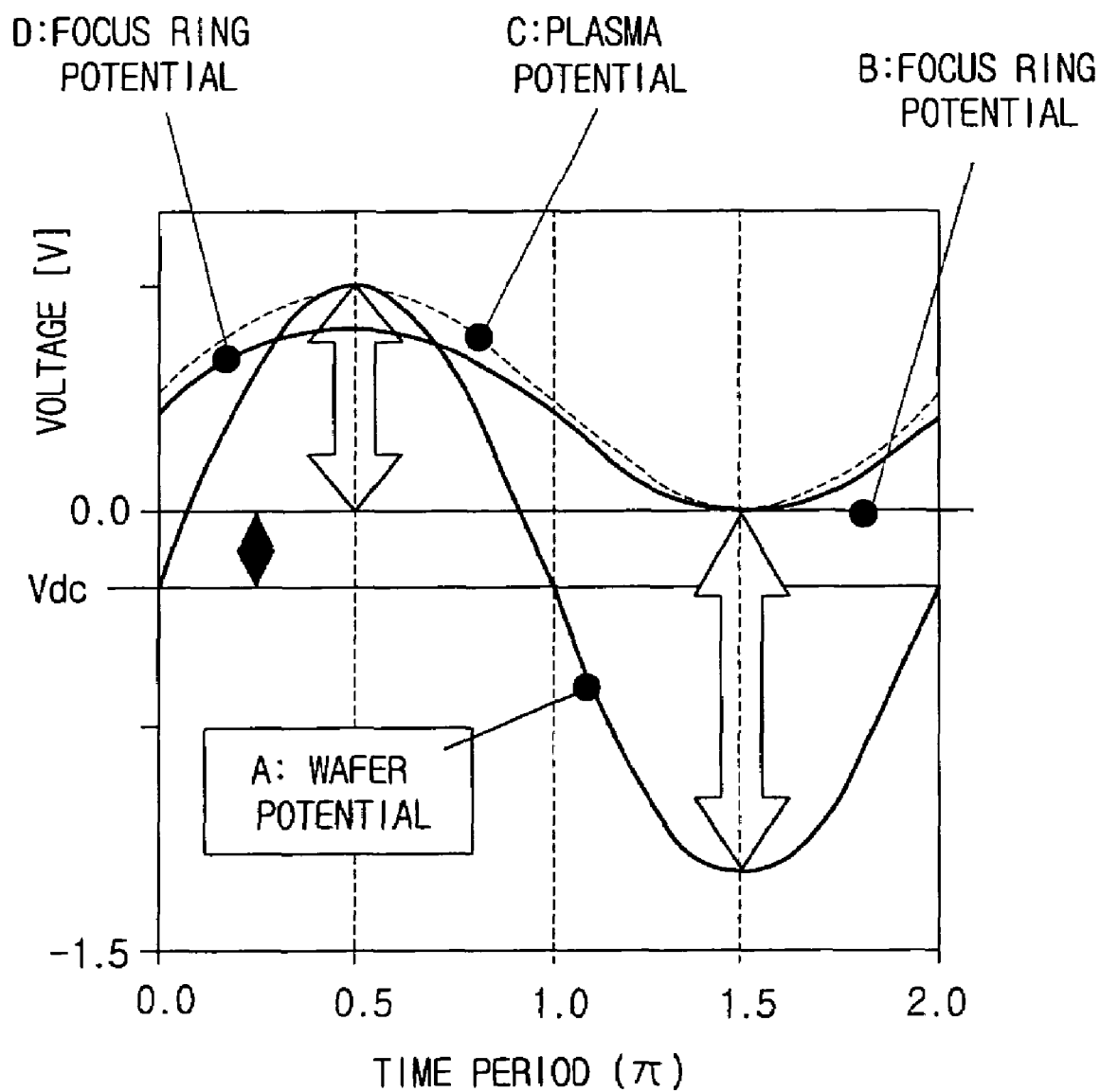
FIG. 12 offers a variation in potential of each portion per a cycle.

A graph of FIG. 12 shows variations of potentials (voltages) of the semiconductor wafer W, the focus ring 50 and the plasma as functions of time, wherein a vertical axis represents a voltage while a horizontal axis stands for a time period. As shown by a curved line A in the same drawing, the potential of the semiconductor wafer W varies depending on a frequency (for example, 2 MHz) of a high frequency applied from the high frequency power supply 7.

On the other hand, since the upper member 52 of the focus ring 50 has a ground potential for the high frequency power, the potential becomes constant as shown by a straight line B. Accordingly, a large potential difference can be obtained between the semiconductor wafer W and the upper member 52 either when a high frequency cycle is in the plus side or when in the minus side, as shown by arrows in the drawing.

Further, in the same drawing, a curved line C shows a plasma potential variation and a curved line D shows a potential variation of the upper member 10 of the focus ring 8 shown in FIG. 2. As shown by the curved line D, in the focus ring 8 shown in FIG. 2, when the high frequency cycle is in the plus side, the potential difference between the semiconductor wafer W and the upper member 10 becomes small. Such a potential difference variation in accordance with a high frequency oscillation can be controlled by making the upper member 52 to have a ground potential for the high frequency power as described above.

Figure 13A:
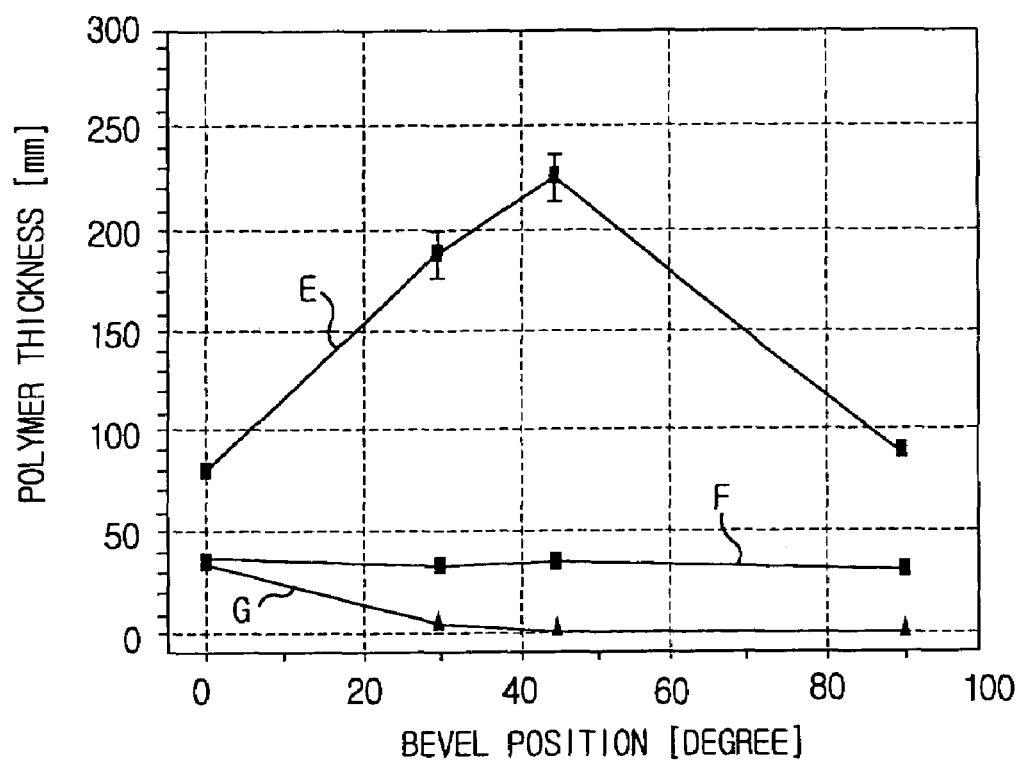
FIGS. 13A and 13B show a measurement result of a polymer adhesion amount on a beveled portion of a wafer.
Figure 13B:
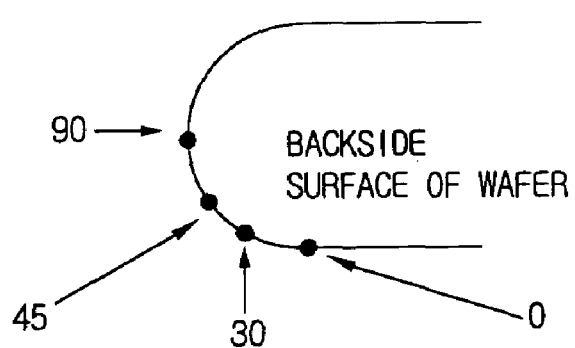

A graph of FIG. 13A shows polymer adhesion amounts in 0°, 30°, 45°, 90° positions of a beveled portion of a semiconductor wafer shown in FIG. 13B, respectively, wherein a vertical axis represents a polymer thickness while a horizontal axis stands for a bevel position. In FIG. 13A, solid lines E, F, and G represent a result obtained when the conventional focus ring 101 shown in FIG. 15 was employed, a result obtained when the focus ring 8 shown in FIG. 2 is employed and a result obtained when the focus ring 50 shown in FIG. 11 was employed, respectively. As illustrated in this graph, in case of using the focus ring 50, an electric field intensity between the semiconductor wafer and the focus ring can be increased, thereby preventing the plasma from reaching therebetween and reducing an amount of radicals therebetween.

Thus, the polymer deposition amount in the wafer beveled portion can be further reduced compared to the case when the focus ring 8 was employed.

Further, although there is described the case when the upper member 52 is connected to the ground potential for the high frequency power through the high frequency grounding member 53 in the above preferred embodiment, the upper member 52 may be connected to the ground potential for the high frequency power by using another method without employing the high frequency grounding member 53 of such a configuration.

Figure 14A:
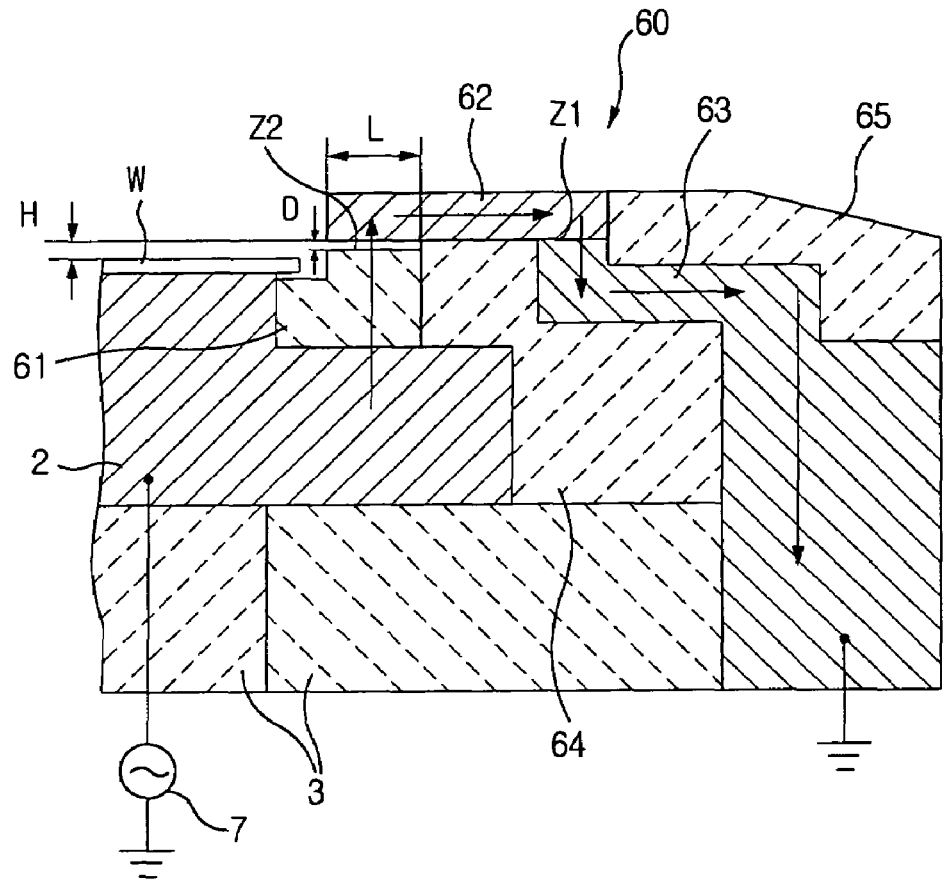
FIGS. 14A and 14B represent a configuration of a focus ring in accordance with still another preferred embodiment.
Figure 14B:
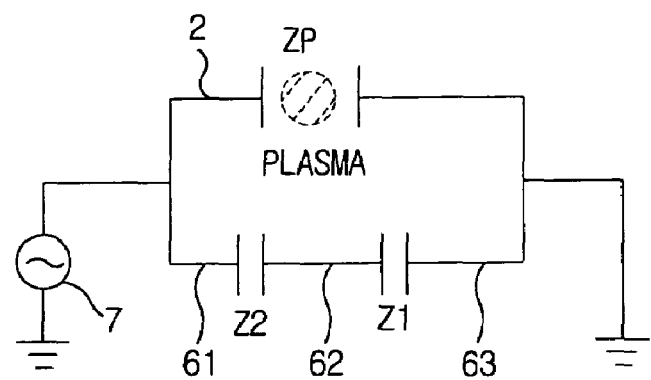

FIG. 14A depicts schematically a cross sectional view showing a configuration of a focus ring 60 in accordance with another preferred embodiment. In the same way as described above, a susceptor 2, on which a semiconductor wafer W is mounted, is supported by an insulating plate 3 and connected to a high frequency power supply 7.

Further, the focus ring 60 is disposed on a peripheral portion of the susceptor 2. The focus ring 60 includes an annular lower member 61 made of a dielectric (for example, quartz, ceramics such as alumina, resin such as Vespel (a registered trademark) or the like), and an annular upper member 62 made of a conductive material (for example, silicon, carbon, SiC or the like) and mounted on the lower member 61. Further, the focus ring 60 is disposed to surround the semiconductor wafer W, i.e., a substrate to be processed.

The upper member 62 is made of a conductive material, e.g., aluminum, and connected to a ground potential for a high frequency power through a high frequency grounding member 63 whose surface is coated with an insulating layer (an insulating film) such as a thermally sprayed coating (for example, FCC (fine ceramics coat) of, e.g., Al/Al$_2$O$_3$ and Y$_2$O$_3$) made of ceramics. This insulating layer is formed in order to protect the high frequency grounding member 63 from a plasma and prevent a DC current from flowing therethrough. That is, the insulating layer is thick enough to prevent the DC current from passing therethrough to thereby block the DC current and prevent it from propagating further. On the other hand, a high frequency that can be propagated on a surface of a solid body as a surface wave can be propagated on the surface layer of the high frequency grounding member 63 which serves as a ground channel of the high frequency. Respectively disposed between the high frequency grounding member 63 and the susceptor 2, and at the outer peripheral side of the upper member 62 (on the high frequency grounding member 63) are ring-shaped insulation members 64 and 65 made of a dielectric (for example, quartz, ceramics such as alumina, resin such as Vespel (a registered trademark) or the like). The insulation member 64 is for preventing a DC voltage component from leaking to the outside from the susceptor 2. Further, the insulation member 65 serves to prevent a plasma from excessively spreading toward an outer peripheral direction, which in turn regulates an electric field to prevent the plasma from excessively spreading and leaking to a gas exhaust side from a gas exhaust baffle (not shown).

Additionally, in accordance with the preferred embodiment, a predetermined gap D of about 0.5 mm is provided between the lower member 61 and the upper member 62. Further, a diametrical direction length L of a portion of the lower member 61, which faces the upper member 62 with the gap D therebetween, ranges from 5 to 10 mm. Further, the bottom of the upper member 62 is configured to be positioned higher by from 1.5 to 2.5 mm (H in the drawing) than the top surface of the semiconductor wafer W. Such a configuration is due to the following reason.

That is, as described above, in order to reduce polymer adhesion amounts in the beveled portion (90°, 45° and 30° portions shown in FIG. 13B) and the end portion of the backside surface (0° portion shown in FIG. 13B) of the semiconductor wafer, the temperature of the lower member 61 during the plasma process is maintained at a relatively low temperature, which is preferably lower than, e.g., 100° C. and more preferably equal to or less than 70° C. On the other hand, the upper member 62 is preferably maintained at a relatively high temperature, e.g., equal to or higher than 250° C., during the plasma process. A reason for making the temperature of the upper member 62 to be equal to or higher than 250° C. is to speed up a combination of a fluorine radical and Si to thereby reduce an amount of fluorine radicals and prevent an etching rate from being increased in the peripheral portion of the semiconductor wafer in an etching application such as a photoresist or SiN having a strong chemical reactivity. As described above, since the temperature of the lower member 61 and that of the upper member 62 are maintained differently, the predetermined gap D is provided between the lower member 61 and the upper member 62. Further, in order to increase the temperature of the upper member 62, the upper member 62 needs to be heated by means of Joule heat generated by increasing an applied high frequency (a frequency of, e.g., 2 MHz) voltage flowing along a route from the susceptor 2 to the high frequency grounding member 63 via the lower member 61 and the upper member 62, as indicated by arrows in the drawing. Accordingly, an impedance of the route needs to be low. It is preferable that the gap D is set to be about 0.5 mm in order to satisfy the above-mentioned conditions.

That is, from the fact that the gap D is preferably about 0.5 mm to satisfy the above-mentioned conditions, it can be conceived that at least 3 to 10 times a plasma impedance $Z_p$ is needed in order to heat the upper member 62 up to equal to or higher than a predetermined temperature, i.e., 250° C., when the high frequency power of 2 MHz is applied. Moreover, since the high frequency is AC, a loading effect needs to be determined by taking a resistance as well as an electrostatic capacitance (capacitor) or an inductance (coil) into consideration. Hereinafter, there will be described by using an impedance (a component opposing the alternating current) which is a combination thereof. An impedance at a contact portion between the upper member 62 and the high frequency grounding member 63 is referred to as Z1 and the gap D functions as a capacitor: C2 in a vacuum atmosphere. An impedance around this gap D is referred to as Z2 and it is preferable in view of controllability that Z2 is at least 10 times impedance Z1 to become a high resistance.

$$Z2 \geq 10 \times Z1$$

$$3Z_p \leq Z1 + Z2 \leq 10Z_p \text{ in FIG. } \mathbf{14B}$$

A value of D to satisfy these equations can be obtained from the following equation.

$$\text{impedance}[\Omega]: Z2 = (wC)^{-1} = [w \cdot \in 0 \cdot \in (S/D)]^{-1}$$

($\in 0$=vacuum dielectric constant, S=area [m$^2$], D=distance [m])

Since a surface area of the lower member 61 in 200 mm wafer is different from that in 300 mm wafer, a desired value is substituted for the surface area of the lower member 61 in the equation to thereby determine the gap D. Accordingly, the above equation can be applied to a lower member of a substrate processing apparatus for performing a plasma process on, e.g., an LCD substrate having a larger area, not limited to a semiconductor wafer. As a result, the upper member 62 and the lower member 61 in a non-contact state can have a configuration without a heat transfer and, at the same time, the high frequency which is a surface wave generated from the high frequency power supply 7 is transferred to the upper member 62 through the capacitance (gap D) by an electrostatic induction theory. Besides, in case that a heat insulating member is provided in the gap D portion, the dielectric constant of the portion is limited to that of the heat insulating member. However, in accordance with the present invention, there is provided a vacuum capacitance having an excellent controllability, wherein a dielectric constant $\in$ can be variably controlled by controlling a vacuum level in a processing chamber.

Further, in order to reduce a heat conduction and prevent a heat loss, a gap may be provided between the upper member 62 and the high frequency grounding member 63. Furthermore, if the lower member 61 and the upper member 62 can be controlled to have the above-described temperature, another configuration may be employed.

Moreover, as described above, in order to perform a substantially vertical etching by controlling the electric field of the peripheral portion of the semiconductor wafer, the bottom of the upper member 62 is configured to be positioned higher by from 1.5 to 2.5 mm (H in the drawing) than the top surface of the semiconductor wafer W.

In accordance with the preferred embodiment of the present invention, the polymer deposition amount can be reduced in the beveled portion of the wafer and, further, it is possible to prevent the etching rate of the photoresist from being increased in the peripheral portion of the semiconductor wafer and perform a substantially vertical etching also in the peripheral portion of the semiconductor wafer, whereby improving an in-surface uniformity of a process.

While the invention has been shown and described with respect to the preferred embodiments, it will be understood by those skilled in the art that various changes and modifications may be made without departing from the spirit and scope of the invention as defined in the following claims.

What is claimed is:

1. A focus ring having an annular shape, disposed to surround a substrate to be processed on a lower electrode for mounting the substrate to be processed thereon in a processing chamber for accommodating the substrate to be processed on which a specified plasma process is to be performed, which comprises:
    a lower member made of a dielectric; and
    an upper member disposed on the lower member and made of a conductive material,
    wherein the upper member is grounded,
    wherein a predetermined gap is provided between the upper member and the lower member to thereby maintain a temperature of the lower member to be different from that of the upper member,
    wherein the upper member is grounded by being connected to a conductive high frequency grounding member, whose surface is coated with an insulating layer, and the insulating layer protects the high frequency grounding member from a plasma of the specified plasma process and prevents a DC current from flowing through the high frequency grounding member,
    wherein an insulation member is disposed between the lower member and the high frequency grounding member, and
    wherein the insulation member surrounds the lower member and prevents a DC voltage component from leaking to outside from the lower electrode, and the upper member is in contact with the insulation member without a gap.

2. The focus ring of claim 1, wherein an annular insulation member is disposed at an outer periphery of the upper member.

3. The focus ring of claim 1, wherein the upper member is disposed such that a bottom of the upper member is positioned higher by from 1.5 to 2.5 mm than a top surface of the substrate to be processed.

4. The focus ring of claim 1, wherein a temperature of the upper member is equal to or higher than 250° C. during a plasma process.

5. The focus ring of claim 1, wherein a temperature of the lower member is equal to or higher than 100° C. during a plasma process.

6. The focus ring of claim 1, wherein the predetermined gap between the upper member and the lower member is about 0.5 mm.

7. The focus ring of claim 6, wherein a diametrical direction length of a portion of the lower member which faces the upper member with the predetermined gap therebetween ranges from 5 to 10 mm.

8. A plasma processing apparatus comprising:
    a processing chamber for accommodating a substrate to be processed on which a predetermined plasma process is to be performed;
    a lower electrode, installed in the processing chamber, for mounting the substrate to be processed thereon; and
    a focus ring having an annular shape, wherein the focus ring comprises
    an annular lower member made of a dielectric and disposed on the lower electrode to surround the substrate to be processed; and
    an annular upper member disposed on the lower member and made of a conductive material, the annular upper member having a ground potential,
    wherein a predetermined gap is provided between the upper member and the lower member to thereby maintain a temperature of the lower member to be different from that of the upper member,
    wherein the upper member is grounded by being connected to a conductive high frequency grounding member, whose surface is coated with an insulating layer, and the insulating layer protects the high frequency grounding member from a plasma of the specified plasma process and prevents a DC current from flowing through the high frequency grounding member,
    wherein an insulation member is disposed between the lower member and the high frequency grounding member, and
    wherein the insulation member surrounds the lower member and prevents a DC voltage component from leaking to outside from the lower electrode, and the upper member is in contact with the insulation member without a gap.

* * * * *